US011688691B2

(12) United States Patent
Lin et al.

(10) Patent No.: US 11,688,691 B2
(45) Date of Patent: Jun. 27, 2023

(54) METHOD OF MAKING STANDARD CELLS HAVING VIA RAIL AND DEEP VIA STRUCTURES

(71) Applicant: Taiwan Semiconductor Manufacturing Co., Ltd., Hsinchu (TW)

(72) Inventors: Wei-Cheng Lin, Taichung (TW); Cheng-Chi Chuang, New Taipei (TW); Chih-Liang Chen, Hsinchu (TW); Charles Chew-Yuen Young, Cupertino, CA (US); Hui-Ting Yang, Zhubei (TW); Wayne Lai, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 17/164,449

(22) Filed: Feb. 1, 2021

(65) Prior Publication Data

US 2021/0183772 A1 Jun. 17, 2021

Related U.S. Application Data

(62) Division of application No. 15/938,258, filed on Mar. 28, 2018, now Pat. No. 10,930,595.

(Continued)

(51) Int. Cl.
*H01L 23/535* (2006.01)
*H01L 21/768* (2006.01)
*H01L 27/02* (2006.01)
*H01L 27/088* (2006.01)
*H01L 27/118* (2006.01)
*H01L 29/78* (2006.01)

(52) U.S. Cl.
CPC ...... *H01L 23/535* (2013.01); *H01L 21/76895* (2013.01); *H01L 27/0207* (2013.01); *H01L 27/0886* (2013.01); *H01L 27/11807* (2013.01); *H01L 29/785* (2013.01); *H01L 2027/11875* (2013.01); *H01L 2027/11881* (2013.01)

(58) Field of Classification Search
CPC ............ H01L 23/535; H01L 21/76895; H01L 27/0207; H01L 27/0886
USPC .......................................................... 257/401
See application file for complete search history.

(56) References Cited

U.S. PATENT DOCUMENTS 9,653,394 B2 5/2017 Lau et al.
2003/0075744 A1 4/2003 Horita et al.
(Continued)

FOREIGN PATENT DOCUMENTS

CN 1809914 A 7/2006

*Primary Examiner* — Nduka E Ojeh
*Assistant Examiner* — Laura M Dykes
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to forming via rail and deep via structures to reduce parasitic capacitances in standard cell structures. Via rail structures are formed in a level different from the conductive lines. The via rail structure can reduce the number of conductive lines and provide larger separations between conductive lines that are on the same interconnect level and thus reduce parasitic capacitance between conductive lines.

20 Claims, 8 Drawing Sheets

Related U.S. Application Data

(60) Provisional application No. 62/564,810, filed on Sep. 28, 2017.

(56) References Cited

U.S. PATENT DOCUMENTS

| | | |
|---|---|---|
| 2008/0067613 A1 | 3/2008 | Anderson et al. |
| 2009/0184424 A1 | 7/2009 | Furusawa et al. |
| 2010/0123253 A1 | 5/2010 | Ooka |
| 2012/0205626 A1 | 8/2012 | Dimitrakopoulos et al. |
| 2014/0151812 A1* | 6/2014 | Liaw ................ H01L 21/76897 438/672 |
| 2014/0284813 A1 | 9/2014 | Greco |
| 2016/0064280 A1 | 3/2016 | Ookita et al. |
| 2016/0181255 A1* | 6/2016 | Nii ........................... G11C 8/16 257/369 |
| 2017/0033102 A1 | 2/2017 | Kim et al. |
| 2017/0133365 A1 | 5/2017 | Lim et al. |
| 2017/0221818 A1 | 8/2017 | Lau et al. |
| 2018/0130699 A1 | 5/2018 | Zhang et al. |
| 2018/0342454 A1 | 11/2018 | Zhang et al. |
| 2018/0350791 A1 | 12/2018 | Do et al. |

\* cited by examiner

METHOD OF MAKING STANDARD CELLS HAVING VIA RAIL AND DEEP VIA STRUCTURES

This application is a divisional of U.S. Non-provisional patent application Ser. No. 15/938,258, titled "Standard Cells Having Via Rail and Deep Via Structures," which was filed on Mar. 28, 2018, which claims the benefit of U.S. Provisional Patent Application No. 62/564,810, titled "Standard Cells Having Via Rail and Deep Via Structures," which was filed on Sep. 28, 2017, all of which are incorporated herein by reference in their entirety.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 7A-10C are layout views and cross-sectional views of standard cell structures having via rail and deep via structures, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity varies by, for example, within ±5% of the value (e.g., ±5%, ±4%, ±3%, ±2%, or ±1% of the value).

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

An integrated circuit includes multiple semiconductor devices which are electrically connected together by interconnect structures. The interconnect structure includes, for example, metal lines which provide routing between the semiconductor devices in a direction parallel to a top surface of a substrate of the integrated circuit. Metal lines on different layers and levels on the integrated circuits can be electrically connected together by conductive via structures. The conductive vias are formed to have their bottom surfaces electrically connected to metal lines formed in a first interconnect level below the conductive vias, and to have their top surfaces electrically connected to metal lines formed in a second interconnect level above the conductive vias.

One or more conductive structures such as, for example, conductive vias and metal lines can be spaced apart from each other by dielectric material to prevent short-circuiting within the integrated circuit. Electrical current passing through the metal lines and conductive vias of the interconnect structure introduce capacitances between adjacent metal lines or conductive vias. In some instances, these capacitances are called parasitic capacitance which is an unintended consequence due to routing metal lines and conductive vias within the interconnect structure. Parasitic capacitance impacts performance of integrated circuits. For example, as parasitic capacitance within an integrated circuit increases, dynamic power consumption of the integrated circuit also increases.

As technologies progress, integrated circuits are characterized by decreasing dimension requirements over previous generations of devices. Separations between conductive structures of integrated circuits can be reduced to accommodate the decreasing device dimensions. However, reduced separations between conductive structures can lead to increased parasitic capacitance that has become a dominant factor affecting device power consumption.

Various embodiments in accordance with this disclosure provides mechanisms of forming via rail and deep via structures to reduce parasitic capacitances in standard cell structures. The via rail and deep via structures can be connected to one or more gate terminals, one or more drain terminals, and/or one or more source terminals of transistor devices (e.g., finFET devices, double-gate devices, tri-gate devices, omega FETs, and gate all around devices). Similar to a M0 metal line, conductive via rail structure such as the via rail structure can be used to connect various semiconductor devices of the integrated circuit. However, the via rail structures are formed in a different interconnect level from M0 metal lines (e.g., a local interconnect that represents a first interconnect level and electrically connects to an underlying semiconductor device through a via). For example, the via rail structures can be formed in a different interconnect level or dielectric layer. The via rail structure can reduce the number of M0 metal lines and provide larger separations between M0 metal lines that are on the same interconnect level and thus reduce parasitic capacitance between M0 metal lines. In addition, by forming the via rail structures in a layer different (and possibly further away) from the layer of M0 metal lines, one or more parasitic capacitances in an upper level (e.g., in an M0 interconnect level) can be reduced. Further, the deep via structures can provide electrical connections between a metal conductive layer and gate, drain, and/or source terminals of semiconductor devices. In accordance with some embodiments of this disclosure, the via rail and deep via structures have at least the following benefits: (i) reduced dynamic power consumption due to reduced parasitic capacitance; (ii) compatibility with current layout design and process flow without the need for additional masks; (iii) no gate density degradation; and (iv) various via rail and deep via designs providing circuit design flexibility.

Figure 1A:
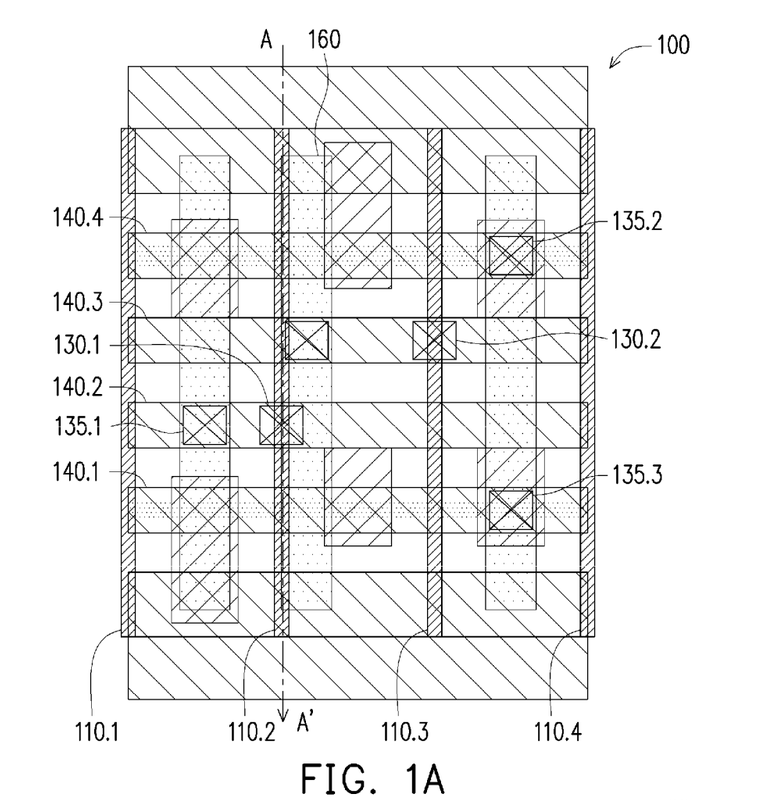
FIGS. 1A-1B are respective layout view and cross-sectional view of an exemplary standard cell structure, in accordance with some embodiments.
Figure 1B:
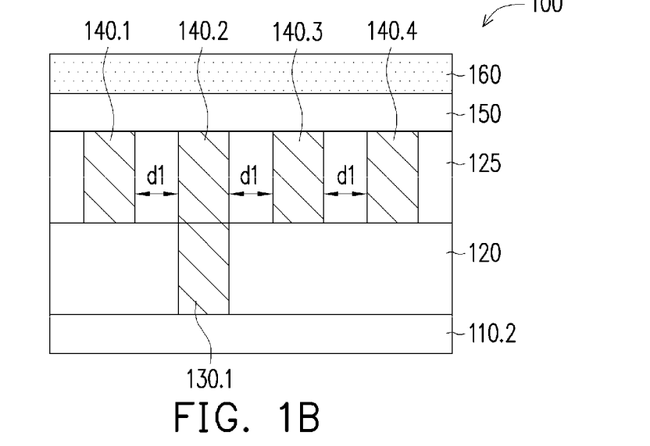

FIGS. 1A and 1B are respective top-down layout view and cross-sectional view of an exemplary standard cell structure 100. Standard cell structure 100 can include gate structures 110.1-110.4, a first dielectric layer 120, a second dielectric layer 125, first via structures 130.1 and 130.2, second via structures 135.1-135.3, M0 metal lines 140.1-140.4, a third dielectric layer 150, and M1 metal line 160.

FIG. 1A is a top-down layout view of standard cell structure 100, and structures on different layers are shown for illustrative purposes. As shown in FIG. 1A, gate structures 110.1-110.4 are formed substantially perpendicular to M0 metal lines 140.1-140.4. M0 metal lines 140.1-140.4 can be metal lines in a metal 0 layer of a back-end-of-line (BEOL) interconnect structure. For example, M0 metal lines can be local interconnects that represent a first interconnect level and electrically connect to an underlying semiconductor device through one or more vias. In some embodiments, gate structures 110.1-110.4 can be gate structures of transistor devices such as, for example, fin field-effect transistors (FinFETs), planar transistors, and/or other suitable transistors. Transistors such as FinFET structures further include a pair of source/drain (S/D) terminals, where a source terminal is referred to as a "source region" and a drain terminal is referred to as a "drain region." The source and drain regions and are interchangeable and are formed in, on, and/or surrounding fins of the FinFET device. S/D terminals can include S/D contact structures that are electrically connected to external circuitry to provide electrical access to the FinFET device during a place and route design stage. The layout design rules may vary across different semiconductor fabrication technology nodes.

Via structures 130.1 and 130.2 are formed in first dielectric layer 120 and used to provide electrical connection between the gate structures and the M0 metal lines. For example, first via structure 130.1 is electrically connected to gate structure 110.2 and M0 metal line 140.2. Similarly, first via structure 130.2 is electrically connected to gate structure 110.3 and M0 metal line 140.3. Second via structures 135.1-135.3 can be used to provide electrical connection between the source/drain structures of the transistors and M1 metal line 160 (not visible in FIG. 1A for simplicity). In some embodiments, M1 metal line 160 can be conductive metal lines in a metal 1 layer of the BEOL interconnect structure. For example, M1 metal lines can be local interconnects that represent a second interconnect level—above the first interconnect level—and electrically connects to one or more underlying M0 metal lines through one or more vias. M0 metal lines 140.1-140.4 and M1 metal line 160 are provided as examples, and in some embodiments, configuration of the M0 metal lines, M1 metal lines, and vias can be used in a similar fashion in other metal layers of the BEOL interconnect structures. In addition, M0 metal lines 140.1-140.4 can be electrically connected to M1 metal line 160 through via structures formed in second dielectric layer 150.

FIG. 1B is a cross-sectional view of FIG. 1A along the A-A' line. As shown in FIG. 1B, M0 metal lines 140.1-140.4 are substantially equally spaced in second dielectric layer 125 and separated by low-k dielectric material. For example, M0 metal lines 140.1-140.4 are separated by substantially the same distance $d_1$, as indicated in FIG. 1B. Undesirable parasitic capacitance exists between adjacent M0 lines 140.1-140.4, as M0 metal lines are conductive planar structures that are in parallel with each other. In general, parallel plate capacitance is inversely proportional to the distance between conductive plates (d) and directly proportional to the area of the plates (A) forming the parasitic capacitance. This relationship is expressed as:

$$C = \frac{\varepsilon \cdot A}{d}$$

where C is capacitance;
ε is the dielectric constant of the material between the plates of the capacitor;
A is the area of plates; and
d is the distance between the plates.
As the distance between the plates (d) decreases, parasitic capacitance increases proportionally. Therefore, as dimensions of the semiconductor devices decrease, lateral separations between each of M0 metal lines 140.1-140.4 also decrease, thus increasing parasitic capacitances formed between the adjacent M0 metal lines.

Figure 2A:
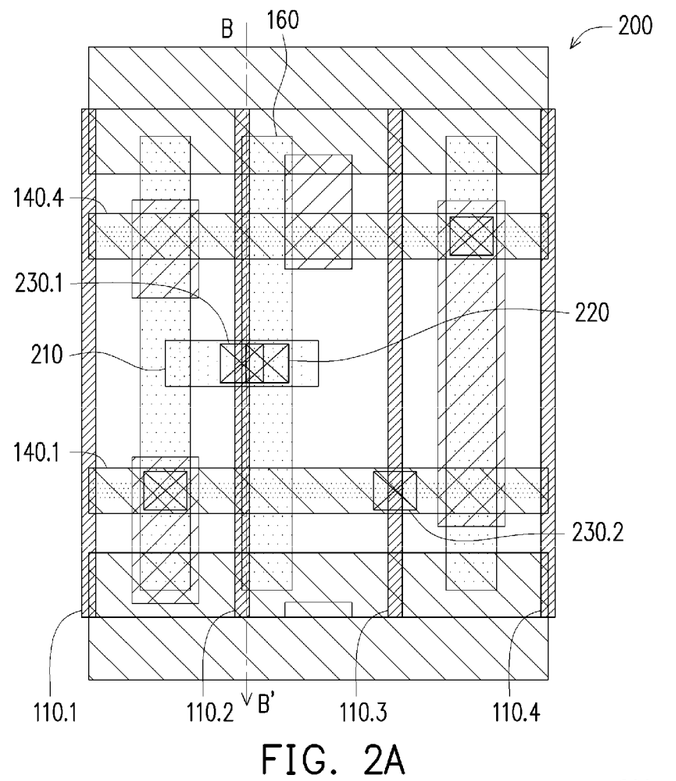
FIGS. 2A-2B are respective layout view and cross-sectional view of an exemplary standard cell structure having via rail and deep via structures, in accordance with some embodiments.
Figure 2B:
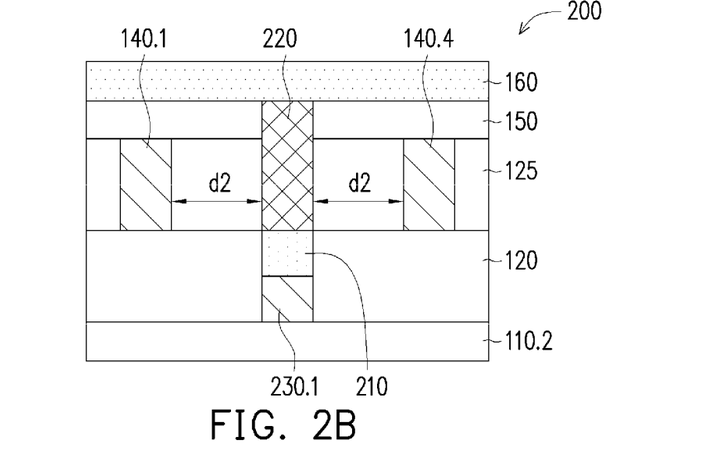

FIGS. 2A and 2B are respective top-down layout view and cross-sectional view of an exemplary standard cell structure 200 having via rail and deep via structures, in accordance with some embodiments of the present disclosure. Similar to standard cell structure 100, standard cell structure 200 can include gate structures 110.1-110.4, first dielectric layer 120, second dielectric layer 125, first via structures 230.1 and 230.2, M0 metal lines 140.1 and 140.4, third dielectric layer 150, and M1 metal line 160. FIG. 2B is a cross-sectional view of FIG. 2A along the B-B' line.

Standard cell structure 200 includes a via rail structure 210 and a deep via structure 220. Each of the first via structures 230.1 and 230.2 can be formed in first dielectric layer 120 and electrically connected to one of the gate structures. For example, first via structures 230.1 is electrically coupled to gate structure 110.2. Although not shown in FIG. 2B, first via structure 230.2 is electrically coupled to gate structure 110.3. Via rail structure 210 is also formed in first dielectric layer 120 and extends perpendicularly with reference to gate structures 110.1-110.4. Similar to M0 metal lines 140.1-140.4, via rail structure 210 can be electrically connected to one or more of the first via structures. In some embodiments, although not shown in FIG. 2B, adjacent first via structures 230.1 and 230.2 can be formed in adjacent gate structures and are electrically to a via rail structure. In some embodiments, via rail structure 210 can be electrically coupled to one or more of the gate structures because the first via structures are electrically connected to their respective gate structures. Deep via structure 220 is formed over via rail structure 210 and extends vertically through second and third dielectric layers 125 and 150 until it is in electrical contact with M1 metal line 160. In some embodiments, M0 metal lines 140.2 and 140.3 described above with reference to FIG. 1B can be replaced by via rail structure 210 and deep via structure 220 without affecting the functionalities of standard cell structure 200. For example, electrical connections between one or more conductive structures of the gate structures 110.1-110.4 may not be affected when the via rail structure 210 and deep via structure 220 replace the M0 metal lines 140.2 and 140.3 to provide electrical connection to conductive structure 110.2. In some embodiments, because via rail structure 210 and deep via structure 220 can be electrically coupled to each gate structure, gate density of the transistor structures is not affected. Further, implementing via rail structure 210 in first dielectric layer 120 may not add additional mask counts because exposure patterns for via rail structures can be implemented on masks that are used for existing structures in first dielectric layer 120. For example, reference metal lines (not shown in figures) can be also be formed in first dielectric layer 120 to provide electrical power supply for structures along the reference metal lines. In some embodiments, exposure patterns for via rail structure 210 are incorporated onto the same masks for the reference metal lines without the need for additional masks.

In some embodiments, via rail structure 210 can be formed in a level different from the level where M0 metal lines 140.1 and 140.4 are formed. For example, via rail structure 210 can be formed in first dielectric layer 120 and M0 metal lines 140.1 and 140.4 can be formed in second dielectric layer 125 of the BEOL interconnect structure. As shown in FIG. 2A, M0 metal lines 140.1 and 140.4 can be in parallel with via rail structure 210. In some embodiments, conductive structures formed in the same level can be separated by a greater distance as compared to the separation between adjacent M0 metal lines described above in FIGS. 1A and 1B. For example, the separation $d_2$ between deep via structure 220 and adjacent M0 metal lines 140.1 or 140.4 illustrated in FIG. 2B can be larger than the separation $d_1$ between adjacent M0 metal lines 140.1 and 140.2 or between M0 metal lines 140.3 and 140.4 of FIG. 1B. As described above, one solution to reduce parasitic capacitance is to increase separation between conductive structures. Metal lines described in FIG. 2B are separated by a greater distance and can result in a reduced parasitic capacitance. Therefore, parasitic capacitance of standard cell structure 200 shown in FIG. 2B can be less than the parasitic capacitance of standard cell structure 100 shown in FIG. 1B which can lead to improved device performance.

Figure 3:
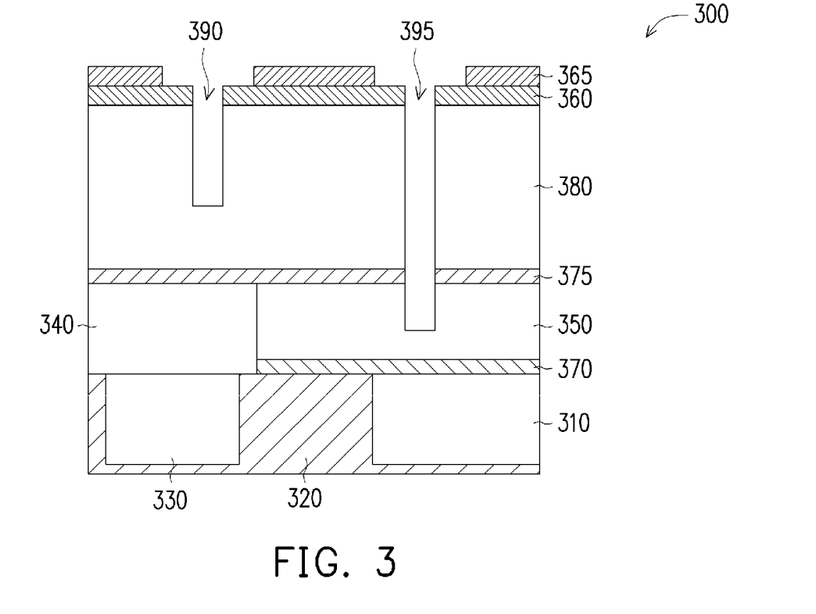
FIGS. 3-5 are cross-sectional views of a fabrication process for forming exemplary standard cell structures having via rail and deep via structures, in accordance with some embodiments.
Figure 4:
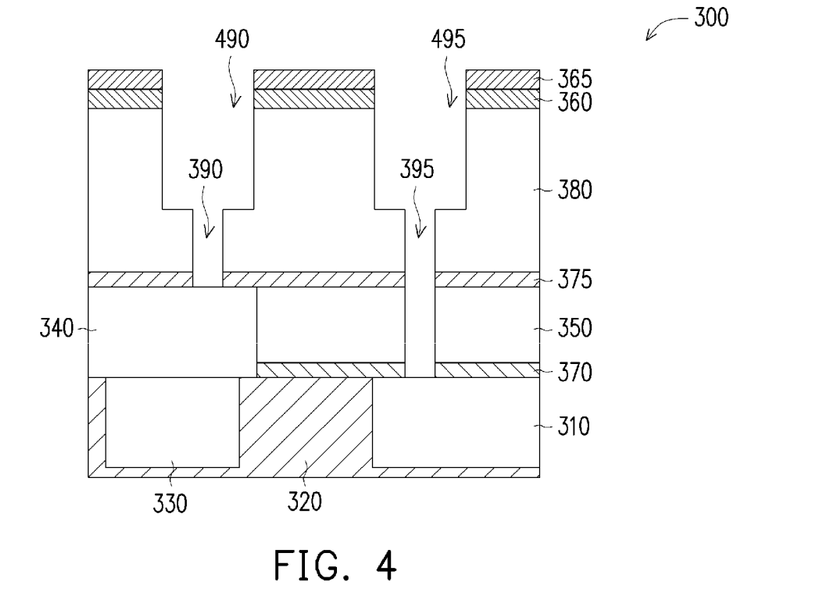
Figure 5:
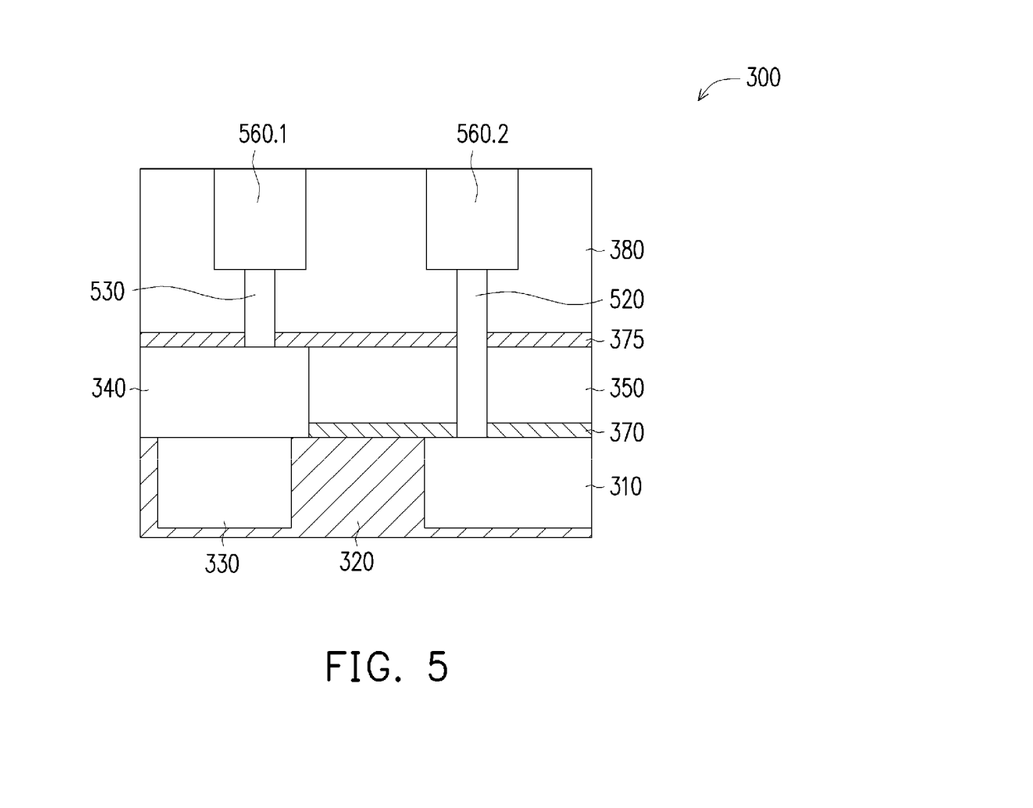
Figure 6:
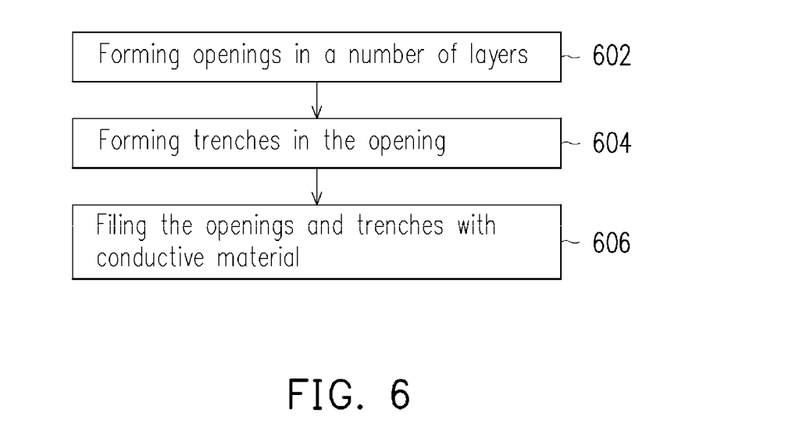
FIG. 6 is a flow diagram of an exemplary method of forming standard cell structures having via rail and deep via structures, in accordance with some embodiments.

FIGS. 3-5 illustrate different fabrication stages of an exemplary standard cell structure 300 having via rail and deep via structures, in accordance with a flow diagram provided in FIG. 6. FIG. 6 is a flow diagram describing an exemplary method 600 of fabricating a standard cell, such as exemplary standard cell structure 300. Exemplary method 600 can include operations 602-606. Operations of method 600 can also be performed in a different order and/or vary. The fabrication process described herein is used to fabricate a standard cell structure that provides reduced parasitic capacitance, according to some embodiments.

Method 600 begins at operation 602 by forming openings in a number of layers of a partially-fabricated standard cell structure, according to some embodiments. In referring to FIG. 3, a cross-sectional view of exemplary standard cell structure 300 is shown. Standard cell structure 300 includes dielectric layers 320, 350, and 380, M0 metal line 340, via rail structures 310 and 330, and other integrated circuit components, fabricated in accordance with operation 602 of method 600. Standard cell structure 300 can also include a substrate and other layers as needed.

First and second via rail structures 310 and 330 are formed in first dielectric layer 320. In some embodiments, first and second via rail structures 310 and 330 are formed using conductive materials such as, for example, copper or copper alloy. In some embodiments, first and second via rail structures 310 and 330 can be formed from other conductive materials such as, for example, tantalum nitride, aluminum, cobalt, tungsten, metal silicides, other suitable metal or metal alloys, and/or combinations thereof. In some embodiments, first and second via rail structures 310 and 330 as well as first dielectric layer 320 are formed over semiconductor devices such as transistors. First and second via rail structures 310 and 330 can be formed by forming trenches in first dielectric layer 320 and depositing the conductive materials in the trenches. First via rail structure 310 can be used to provide electrical connection to one or more device terminals such as gate structures and source/drain structures of semiconductor devices. Second via rail structure 330 can be used to provide electrical connection to a power supply voltage. First dielectric layer 320 can be formed using undoped silica glass (USG), fluorinated silica glass (FSG), a low-k material, an extremely low-k dielectric, other suitable materials, and/or combinations thereof.

M0 metal line 340 can be formed in second dielectric layer 350 and over via 330. Similar to via 330 and via rail structure 310, M0 metal line 340 can be formed using copper and/or other suitable materials listed above. M0 metal line 340 can be used to provide electrical connection to via 330. In some embodiments, M0 metal line 340 can be a metal line formed in a metal 0 layer of a BEOL structure. M0 metal line 340 is provided here as an example and in some embodiments, metal lines in other interconnect levels can be used in a similar fashion. Second dielectric layer 350 can be formed using a material similar to first dielectric layer 320.

First and second etch stop layers 370 and 375 can be formed to provide etch stops when forming openings. First etch stop layer 370 can be formed over first dielectric layer 320 and via rail structure 310. Second etch stop layer 375 can be formed over M0 metal line 340 and second dielectric layer 350. In some embodiments, standard cell structure 300 can include more etch stop layers if needed. In some embodiments, first and second etch stop layers 370 and 375 can be a silicon nitride layer. Third dielectric layer 380 can be formed over second etch stop layer 375 and formed using a material similar to first dielectric layer 320.

First and second hard mask layers 360 and 365 can be formed over third dielectric layer 380 and patterned to protect regions of third dielectric layer during subsequent processing. First hard mask layer 360 can be disposed over and covers a top surface of third dielectric layer 380, and second hard mask layer 365 can be disposed over first hard mask layer 360. In some embodiments, first and second hard mask layers 360 and 365 can be hard mask layers formed of silicon nitride, silicon oxide, other suitable materials, and/or combinations thereof.

In some embodiments, first opening 390 can be formed in third dielectric layer 380 and above M0 metal line 340. In some embodiments, second opening 395 can be formed in both the second and third dielectric layers 350 and 380. First and second openings 390 and 395 are formed in dielectric materials and subsequently filled with conductive material to form vias that connect integrated circuit components on different levels of standard cell structure 300. Using first hard mask layer 360 as an etching mask, etching processes can be performed on exposed material to form first and second openings. The etching processes are used to remove exposed portions of the dielectric materials and can use dry etching processes such as, for example, a reactive ion etch (RIE) and/or other suitable processes. In some embodiments, the etching processes can be formed using wet chemical etching process. In some embodiments, multiple layers of material need to be removed and one or more etching processes may be needed where each process can be selected for etching a specific type of material. For example, second opening 395 can be formed by first removing exposed third dielectric layer 380 and then subsequently removing exposed portions of second hard mask layer 365 using suitable RIE processes. In some embodiments, the etching process can be a timed etching process which can stop before the etch stop layer is exposed and a nominal depth has been reached. In some embodiments, the etching process can continue until the etch stop layers are exposed.

Referring to FIG. 6, method 600 continues with operation 604 by forming trenches in the openings, according to some embodiments. FIG. 4 is a cross-sectional view of exemplary standard cell structure 300 after trenches are formed in the openings. The first and second trenches 490 and 495 are formed in the dielectric materials. In some embodiments, portions of first hard mask layer 360 exposed by second hard mask layer 365 can first be removed using suitable etching processes. First and second trenches 490 and 495 are then formed over respective first and second openings 390 and 395 by etching processes that use second hard mask layer 365 as an etch mask. The etching processes continues until nominal depths of the trenches are achieved. The etching processes of first and second trenches 490 and 495 can be timed etching processes and similar to the etching processes described above with reference to forming openings 390 and 395.

Referring to FIG. 6, method 600 continues with operation 606 by filling the formed openings and trenches with conductive material, according to some embodiments. FIG. 5 is a cross-sectional view of exemplary standard cell structure 300 after the openings and trenches are filled with conductive materials. The first and second openings 390 and 395, as well as first and second trenches 490 and 495, are filled with conductive materials. In some embodiments, conductive materials can be formed using copper, tungsten, cobalt, aluminum, other suitable metals, and/or combinations thereof. In some embodiments, the conductive materials deposited in each opening or trench can be the same. In some embodiments, different conductive materials can be deposited into different trenches. In some embodiments, any suitable deposition process can be used such as, for example, atomic layer deposition (ALD), molecular beam epitaxy (MBE), high density plasma chemical vapor deposition (HDPCVD), metal organic CVD (MOCVD), remote plasma CVD (RPCVD), plasma-enhanced CVD (PECVD), electroplating, electroless plating, other suitable methods, and/or combinations thereof. In some embodiments, the deposition process forms M1 metal lines 560.1 and 560.2 in trenches 490 and 495, respectively. In some embodiments, M1 metal lines 560.1 and 560.2 can be metal lines in a metal 1 layer of a BEOL structure. In some embodiments, the deposition process forms via structure 530 and deep via structure 520 in openings 390 and 385, respectively. Deep via structure 520 can provide electrical connection directly between M1 metal line 560.2 and first via rail structure 310. The hard mask layers can be removed using planarization processes after the deposition process is completed. For example, a chemical mechanical polishing (CMP) process can be used to remove both first and second hard mask layers 360 and 365 and planarize the top surface of standard cell structure 300 such that the top surface of third dielectric layer 380 is coplanar with the top surfaces of M1 metal lines 560.1 and 560.2.

FIGS. 7A-10C are top-down layout views and cross-sectional views of exemplary standard cell structures having via rail and deep via structures, in accordance with some embodiments of the present disclosure. The various via rail structure and deep via designs provide circuit design and routing design flexibility. For illustration purposes, the via rail and deep via structures of the exemplary standard cell structures are formed over and connected to terminals of semiconductor transistor devices. The exemplary standard cell structures can include metal lines and structures formed in the metal 0 or metal 1 interconnect layers of a BEOL structure; however, the configuration of the metal lines and structures provided here are examples, and the configuration can be used in a similar fashion in other metal layers of the BEOL structure. In addition, the exemplary standard cell structures described below can be fabricated using processes similar to the processes described above with reference to FIGS. 3-5.

Figure 7A:
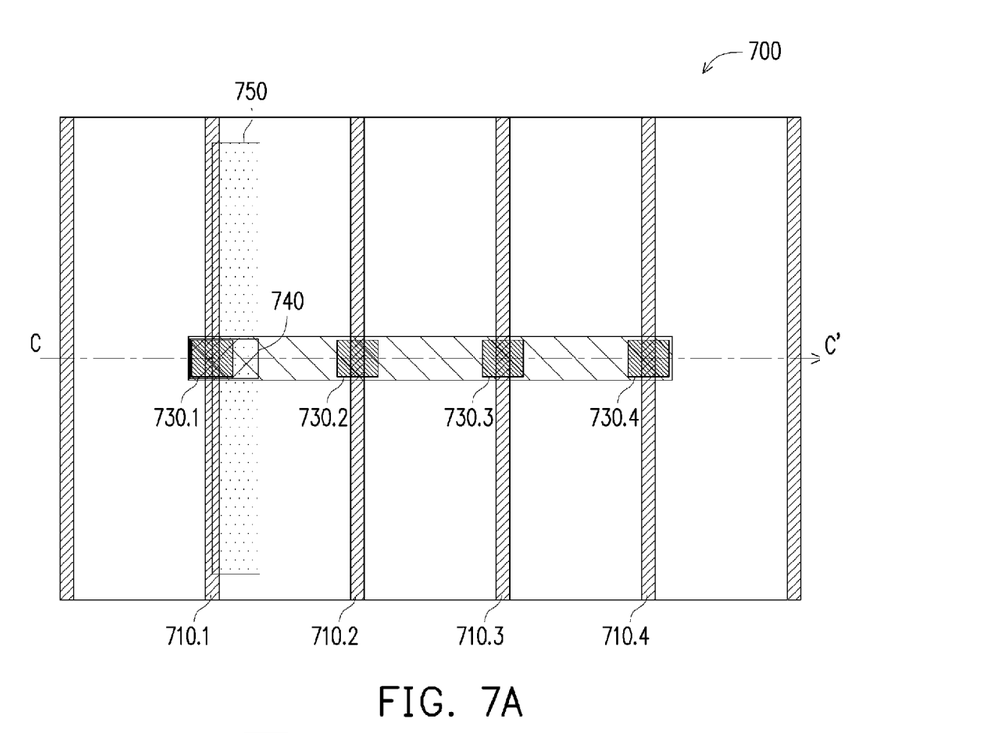
Figure 7B:
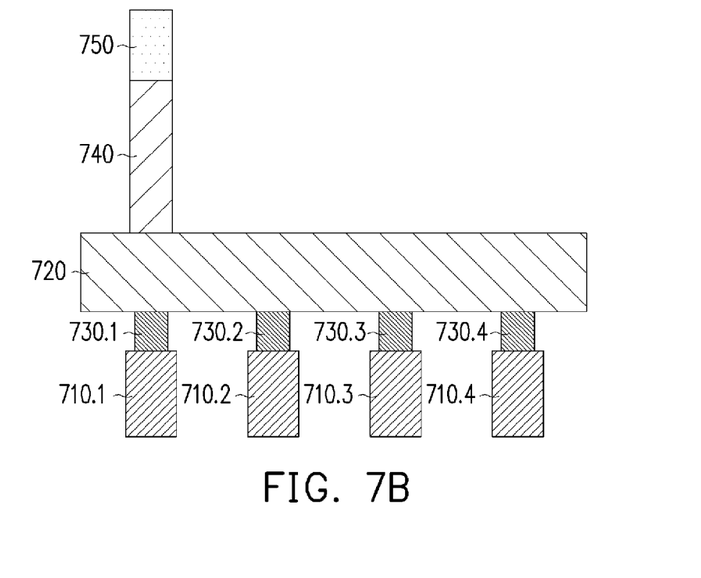

FIGS. 7A and 7B are respective top-down layout view and cross-sectional view of an exemplary standard cell structure 700 having via rail and deep via structures, in accordance with some embodiments of the present disclosure. The via rail and deep via structures illustrated in FIGS. 7A-7B can provide electrical connections to one or more gate structures and source/drain terminals of semiconductor devices in a standard cell structure. Standard cell structure 700 can include gate structures 710.1-710.4, via structures 730.1-730.4, via rail structure 720, deep via structure 740, and metal 1 line 750. Other components can be included in the standard cell structure such as, for example, dielectric layers, etch stop layers, via structures, conductive structures, and/or other suitable structures. These other components are not shown for simplicity purposes.

FIG. 7B is a cross-sectional view of FIG. 7A along the C-C' line. Via structures 730.1-730.4 are respectively formed in dielectric layer and electrically connected to gate structures 710.1-710.4. In some embodiments, via structures 730.1-730.4 are gate vias formed on gate structures. Via rail structure 720 extends in a lateral direction through the exemplary standard cell structure and is substantially perpendicular to the gate structures 710.1-710.4. The bottom surface of via rail structure 720 is electrically connected to a top surface of each of the via structures 730.1-730.4, therefore the via rail structure can be electrically connected to one or more gate structures in a standard cell. In some embodiments, via rail structure 720 can be formed in a level below the metal 0 level of the standard cell structure 700. For example, via rail structure 720 can be formed in a dielectric layer below the metal 0 level. Therefore, via rail structure 720 can be placed further away from conductive structures on the metal 0 level. This configuration in turn provides reduced parasitic capacitance, compared to parasitic capacitance formed between adjacent conductive structures formed on the same interconnect level. Deep via structure 740 is formed on via rail structure 720 to provide electrical connection between different layers of the exemplary standard cell structure 700. For example, deep via structure 740 has a top surface electrically connected to metal 1 line 750 and a bottom surface electrically connected to via rail structure 720. Metal 1 line 750 can be a M1 metal line formed in a metal 1 layer of the BEOL interconnect structure. In some embodiments, metal 1 line 750 can be used to provide pin access in the place and route stage.

Figure 8A:
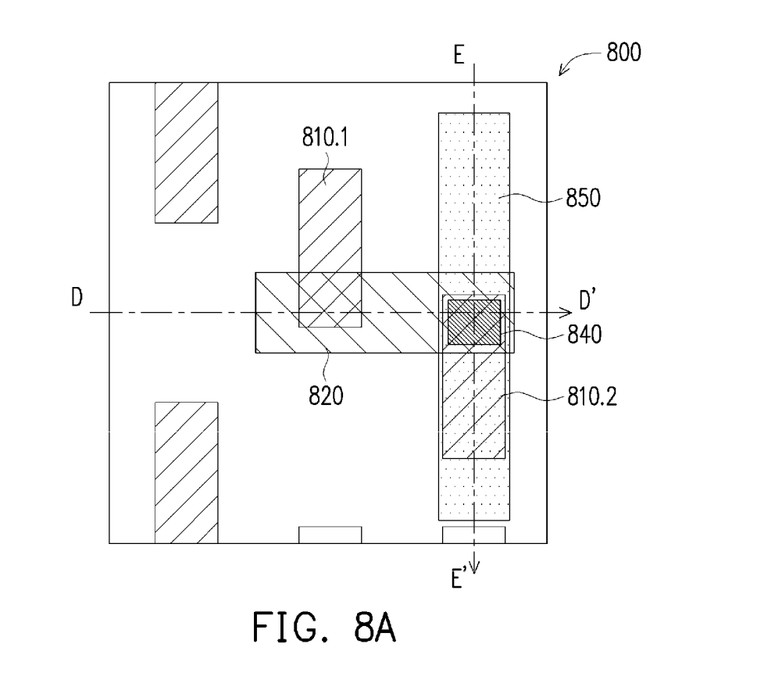
Figure 8B:
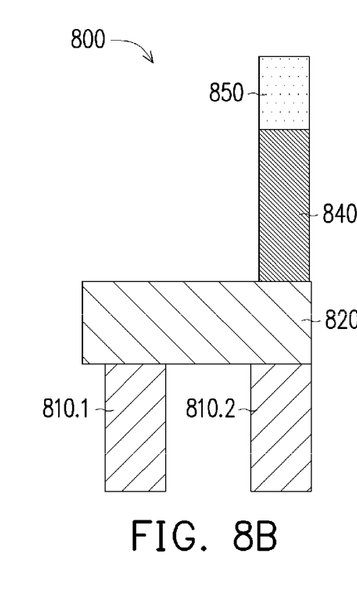
Figure 8C:
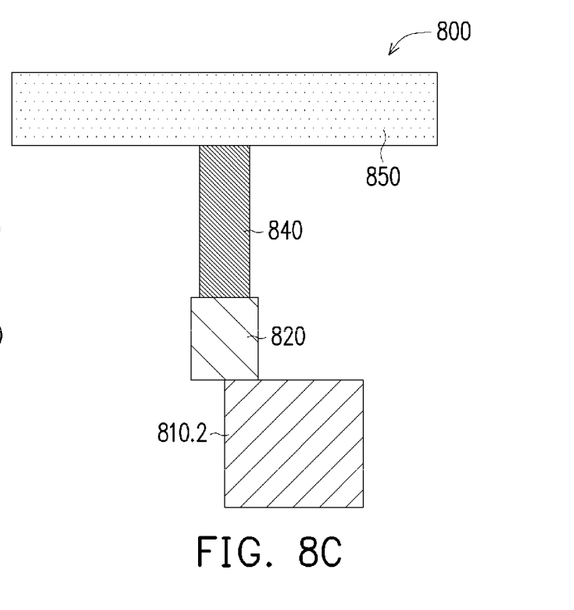

FIGS. 8A-8C are top-down layout view and cross-sectional views of an exemplary standard cell structure 800 having via rail and deep via structures, in accordance with some embodiments of the present disclosure. The via rail and deep via structures illustrated in FIGS. 8A-8C are used to electrically connect to one or more source/drain terminals in a standard cell structure. Standard cell structure 800 can include S/D metal contacts 810.1 and 810.2, via rail structure 820, deep via structure 840, and metal 1 line 850. Other components can be included in the standard cell structure such as, for example, dielectric layers, etch stop layers, via structures, conductive structures, and/or other suitable structures. These other components are not shown for simplicity purposes.

FIG. 8B is a cross-sectional view of FIG. 8A along the D-D' line. FIG. 8C is a cross-sectional view of FIG. 8A along the E-E' line. S/D metal contacts 810.1 and 810.2 can be electrically connected to the source or drain terminal of the semiconductor transistor devices. S/D contact structures such as S/D contacts 810.1 and 810.2 can provide electrical connection to one or more S/D structures and extend in a substantially perpendicular direction with reference to via rail structure 820. The bottom surface of via rail structure 820 is electrically connected to the top surfaces of S/D metal contacts 810.1 and 810.2. In some embodiments, via rail structure 820 is connected to an end portion of S/D metal contact 810.2. For example, as shown in FIG. 8C, a portion of the bottom surface of via rail structure 820 is formed over S/D metal contact 810.2. However, the contact area provides sufficient electrical connection between via rail structure 820 and S/D metal contact 810.2. Similar to via rail structure 720, the top surface of via rail structure 820 is electrically connected to a bottom surface of metal 1 line 850. In addition, via rail structure 820 can be formed in a dielectric layer that is different from the layer metal 0 is formed in. Therefore, via rail structure 820 can be placed further away from conductive structures on the metal 0 level and in turn provides reduced parasitic capacitance, compared to parasitic capacitance formed between adjacent conductive structures on the same interconnect level. Via metal 1 line 850 can electrically connect to one or more S/D metal contacts and in turn electrically connect to one or more S/D structures of transistor devices. Similar to metal 1 line 750 described above, metal 1 line 850 can provide pin access in the place and route stage. Deep via structure 840 can be formed between metal 1 line 850 and via rail structure 820 to provide direct electrical connection.

Figure 9A:
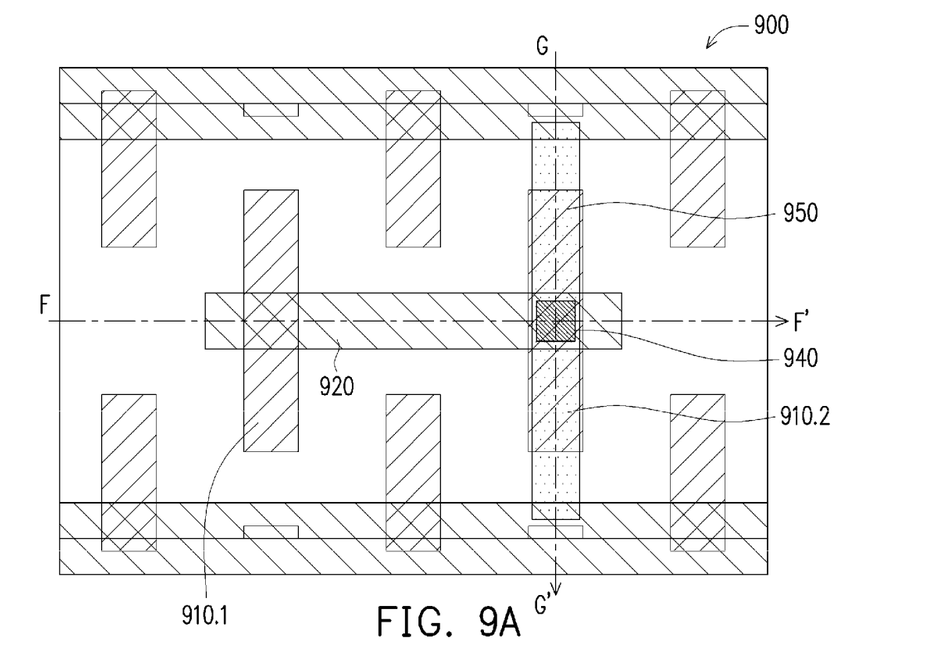
Figure 9B:
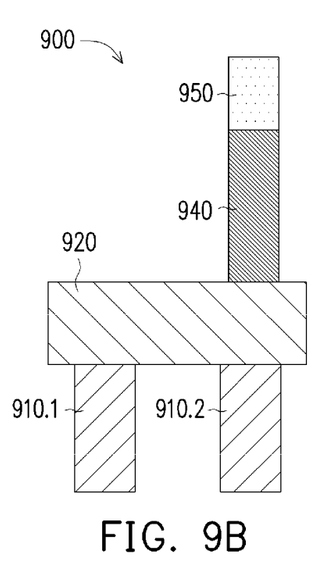
Figure 9C:
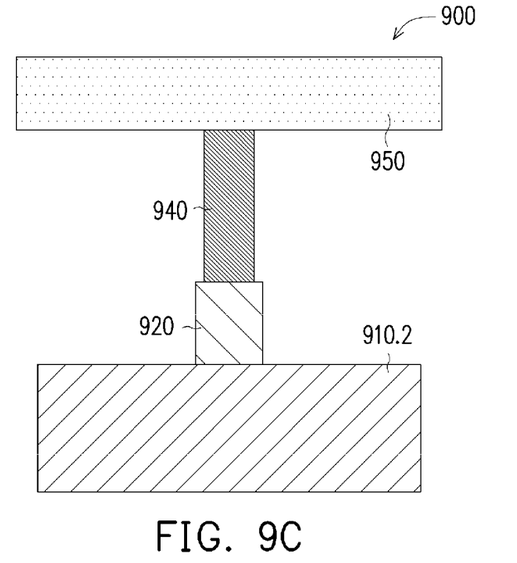

FIGS. 9A-9C are top-down layout view and cross-sectional views of an exemplary standard cell structure 900 having via rail and deep via structures, in accordance with some embodiments of the present disclosure. In some embodiments, via rail and deep via structures are used to electrically connect a number of S/D metal contacts in a standard cell structure. Standard cell structure 900 can include S/D metal contacts 910.1 and 910.2, via rail structure 920, deep via structure 940, and metal 1 line 950. Other components can be included in the standard cell structure such as, for example, dielectric layers, etch stop layers, via structures, conductive structures, and/or other suitable structures. These other components are not shown for simplicity purposes.

FIG. 9B is a cross-sectional view of FIG. 9A along the F-F' line. FIG. 9C is a cross-sectional view of FIG. 9A along the G-G' line. S/D metal contacts 910.1 and 910.2, via rail structure 920, deep via structure 940, and metal 1 line 950, can be formed similar to the corresponding structures described above with reference to FIGS. 8A-8C. In FIGS. 9A-9C, S/D contacts 910.1 and 910.2 provide electrical connection to one or more S/D structures and extend in a substantially perpendicular direction with reference to via rail structure 920. Further, via rail structure 920 can be placed further away from conductive structures on the metal 0 level and in turn provides reduced parasitic capacitance compared to parasitic capacitance between adjacent conductive structures formed on the same interconnect level. As shown in FIG. 9B, via rail structure 920 extends through a middle portion of S/D contacts 910.1 and 910.2 which maximizes contact surface area and in turn reduces contact resistance. Similar to deep via structures 740 and 840, deep via structure 940 includes a top surface that is electrically connected to a bottom surface of metal 1 line 950. Therefore, via metal 1 line 950 can electrically connect to one or more S/D metal contacts and in turn connect to one or more S/D structures of transistor devices. Similar to metal 1 line 750 described above, metal 1 line 950 can provide pin access in the place and route stage.

Figure 10A:
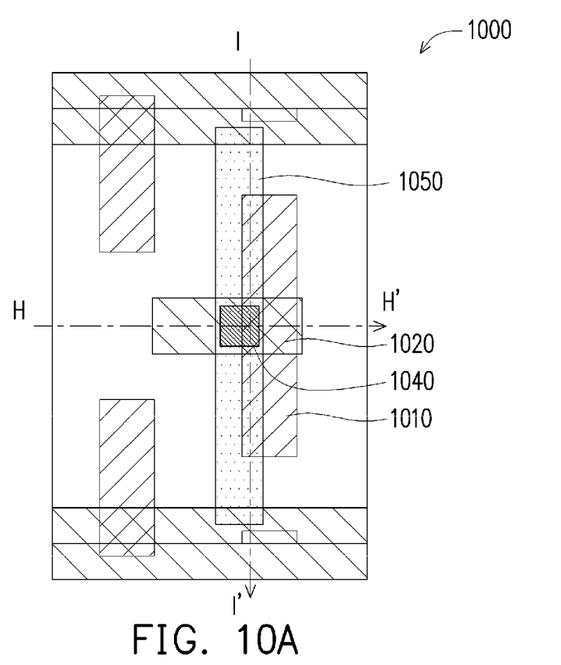
Figure 10B:
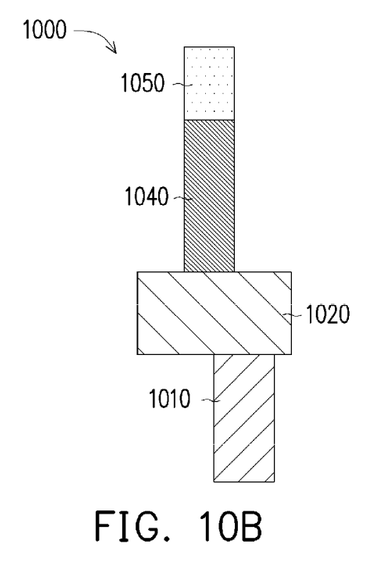
Figure 10C:
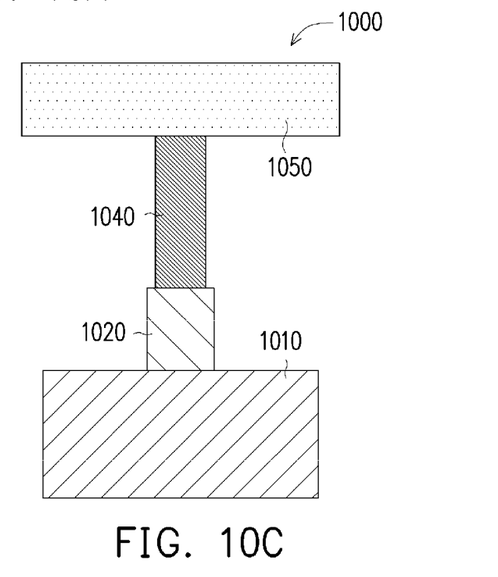

FIGS. 10A-10C are top-down layout view and cross-sectional views of an exemplary standard cell structure 1000 having via rail and deep via structures, in accordance with some embodiments of the present disclosure. In some embodiments, via rail and deep via structures are used to electrically connect one or more of S/D metal contacts in a standard cell structure. Standard cell structure 1000 can include S/D metal contact 1010, via rail structure 1020, deep via structure 1040, and metal 1 line 1050. Other components can be included in the standard cell structure such as, for example, dielectric layers, etch stop layers, via structures, conductive structures, and/or other suitable structures. These other components are not shown for simplicity purposes.

FIG. 10B is a cross-sectional view of FIG. 10A along the H-H' line. FIG. 10C is a cross-sectional view of FIG. 10A along the I-I' line. S/D metal contact 1010, via rail structure 1020, deep via structure 1040, and metal 1 line 1050, can be formed similar to the corresponding structures described above with reference to FIGS. 9A-9C. In FIGS. 10A-10C, S/D contact structure such as S/D contact 1010 provides electrical connection to one or more S/D structures and extend in a substantially perpendicular direction with reference to via rail structure 1020. Via rail structure 1020 can be placed further away from conductive structures on the metal 0 level and in turn provides reduced parasitic capacitance compared to parasitic capacitance between adjacent conductive structures formed on the same interconnect level. Further, similar to via rail structure 920, via rail structure 1020 extends through a middle portion of S/D contact 1010, which maximizes contact surface area and in turn reduces contact resistance. Deep via structure 1040 and metal 1 line 1050 are can be similar to the corresponding structures described above.

Various embodiments in accordance with this disclosure provides mechanisms of forming via rail and deep via structures to reduce parasitic capacitances in standard cell structures. Via rail structures can be formed in a level different from the M0 metal lines. The via rail structure can reduce the number of M0 metal lines and provide larger separations between M0 metal lines that are on the same interconnect level and thus reduce parasitic capacitance between M0 metal lines. Via rail structures can be formed in a layer different from the layer of M0 metal lines, providing low parasitic capacitance between the M0 metal lines and the via rail structures. Further, the deep via structures provide direct electrical connection between a metal conductive layer and the semiconductor devices of the integrated circuit. In accordance with some embodiments of this disclosure, the via rail and deep via structures have at least the following benefits: (i) reduced dynamic power consumption due to reduced device parasitic capacitance; (ii) compatibility with current layout design and process flow without the need for additional masks; (iii) no gate density degradation; and (iv) various via rail and deep via designs providing circuit design flexibility.

In some embodiments, a semiconductor structure includes a plurality of gate structures and a plurality of vias formed in a first dielectric layer. Each via of the plurality of vias is formed on each gate structure of the plurality of gate structures. The semiconductor structure also includes a conductive rail structure formed in the first dielectric layer and over at least one via of the plurality of vias. The conductive rail structure is electrically connected to the at least one via of the plurality of vias. The semiconductor structure also includes a second dielectric layer that is formed over the first dielectric layer and the conductive rail structure. A deep via is formed at least in the second dielectric layer and over the conductive rail structure, and the deep via is electrically connected to the conductive rail structure. A first plurality of metal lines are formed over and electrically connected to the deep via.

In some embodiments, a standard cell structure includes a plurality of source/drain (S/D) contact structures and a via rail structure that is formed in a first dielectric layer and also over two or more S/D contact structures of the plurality of S/D contact structures. The standard cell structure also includes a local interconnect line in parallel with the via rail structure. The local interconnect line is formed in a different interconnect level than the via rail structure. A second dielectric layer is formed over the first dielectric layer and the via rail structure. A deep via formed at least in the second dielectric layer and over the via rail structure is electrically connected to the via rail structure. The standard cell structure further includes one or more conductive structures formed over and electrically connected to the deep via.

In some embodiments, a method of forming a semiconductor structure includes forming a plurality of source/drain (S/D) contact structures; etching a first trench; depositing a first conductive material into the first trench to form a via rail structure over two or more S/D contact structures of the plurality of S/D contact structures. The via rail structure is formed in a different interconnect level than a local interconnect line of the semiconductor structure. The method also includes etching a second trench and depositing a second conductive material into the second trench to form a deep via over and electrically connecting it to the via rail structure. The method further includes etching a third trench and depositing a third conductive material into the third trench to form one or more conductive structures over the deep via and electrically connecting them to the deep via.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming a semiconductor structure, comprising:
   forming a plurality of source/drain (S/D) contact structures;
   depositing a first conductive material to form first and second via rail structures, wherein at least one of the first and second via rail structures is in physical contact with two or more S/D contact structures of the plurality of S/D contact structures, wherein the at least one of the first and second via rail structures extends above opposing vertical sidewalls of each of the two or more S/D contact structures of the plurality of S/D contact structures;
   depositing a second conductive material to form a deep via in physical contact with the second via rail structure;
   forming a first interconnect line above the first and second via rail structures and in physical contact with the first via rail structure, wherein the first interconnect line is formed in a lowest wiring level; and
   forming a second interconnect line over and physically connected to the deep via, wherein the second interconnect line is in a second lowest wiring level.

2. The method of claim 1, further comprising depositing a first dielectric layer and etching a plurality of first trenches in the first dielectric layer.

3. The method of claim 2, wherein depositing the first conductive material comprises depositing copper into the plurality of first trenches.

4. The method of claim 2, further comprising depositing a second dielectric layer on the first dielectric layer and etching a second trench in the second dielectric layer.

5. The method of claim 4, wherein depositing the second conductive material comprises depositing copper into the second trench.

6. The method of claim 2, further comprising depositing an etch stop layer on the first dielectric layer.

7. The method of claim 1, further comprising forming a plurality of gate structures under the first dielectric layer.

8. The method of claim 7, further comprising forming a third via rail structure in the first dielectric layer and electrically connected to the plurality of gate structures.

9. The method of claim 8, further comprising forming a plurality of vias physically connected to the third via rail structure, wherein each via is physically connected to a gate structure of the plurality of gate structures.

10. The method of claim 1, wherein:
depositing the second conductive material comprises forming the deep via based on a first mask; and
forming the second interconnect line comprises depositing the second interconnect line based on a second mask, wherein the second mask is above the first mask.

11. A method for forming a semiconductor structure, comprising:
forming a plurality of source/drain (S/D) contact structures;
depositing a first dielectric layer over the plurality of S/D contact structures;
forming a first via rail in the first dielectric layer, wherein the first via rail is physically connected to a top surface of a S/D contact structure of the plurality of S/D contact structures, wherein the first via rail extends above opposing sides of the S/D contact structure, wherein the opposing sides of the S/D contact structure are connected to the top surface of the S/D contact structure;
forming a second via rail in the first dielectric layer;
depositing a second dielectric layer over the first dielectric layer;
forming a first interconnect line in the second dielectric layer and in physical contact with the first via rail, wherein the first interconnect line is formed in a lowest wiring level;
depositing a third dielectric layer over the second dielectric layer;
etching the second and third dielectric layers to form an opening, wherein the opening exposes a portion of the second via rail;
depositing a conductive material in the opening to form a deep via, wherein a bottom portion of the deep via is in physical contact with the exposed portion of the second via rail; and
forming a second interconnect line in the third dielectric layer—and in contact with a top portion of the deep via, wherein the second interconnect line is formed in a second lowest wiring level.

12. The method of claim 11, wherein forming the first via rail comprises etching a first trench in the first dielectric layer and depositing an other conductive material in the first trench.

13. The method of claim 12, wherein forming the second via rail comprises etching a second trench in the first dielectric layer and depositing the other conductive material in the second trench.

14. The method of claim 11, wherein depositing the conductive material comprises depositing copper.

15. The method of claim 11, further comprising forming an etch stop layer on the first dielectric layer, wherein the opening extends through the etch stop layer.

16. A method for forming a semiconductor structure, comprising:
forming a plurality of transistor devices, comprising first and second pluralities of source/drain (S/D) contact structures;
depositing a dielectric layer on the first and second pluralities of S/D contact structures;
etching the dielectric layer to expose the first and second pluralities of S/D contact structures, respectively;
depositing a conductive material on top surfaces of first and second pluralities of S/D contact structures to form first and second via rails, respectively, wherein:
the first via rail extends above opposing sides of each of the first plurality of S/D contact structures, wherein the opposing sides of each of the first plurality of S/D contact structures are perpendicular to the top surfaces; and
the second via rail extends above opposing sides of each of the second plurality of S/D contact structures wherein the opposing sides of each of the second plurality of S/D contact structures are perpendicular to the top surfaces;
forming a first interconnect line physically connected to the first via rail, wherein the first interconnect line is formed in a lowest wiring level;
forming a deep via in physical contact with the second via rail at a bottom portion of the deep via; and
forming a second interconnect line in physical contact with the deep via at a top portion of the deep via, wherein the second interconnect line is formed in a second lowest wiring level.

17. The method of claim 16, wherein depositing the conductive material comprises depositing copper.

18. The method of claim 16, further comprising depositing an etch stop layer on the dielectric layer.

19. The method of claim 16, further comprising forming, in the dielectric layer, a third via rail connected to a plurality of gate structures of the plurality of transistor devices.

20. The method of claim 16, wherein etching the dielectric layer comprises forming first and second trenches, and wherein depositing the conductive material comprises depositing copper into the first and second trenches.

* * * * *

UNITED STATES PATENT AND TRADEMARK OFFICE
CERTIFICATE OF CORRECTION

| | |
|---|---|
| PATENT NO. | : 11,688,691 B2 |
| APPLICATION NO. | : 17/164449 |
| DATED | : June 27, 2023 |
| INVENTOR(S) | : Lin et al. |

It is certified that error appears in the above-identified patent and that said Letters Patent is hereby corrected as shown below:

In the Claims

In Column 14, Claim 16, Line 25, delete "structures" and insert -- structures, --, therefor.

Signed and Sealed this
Twenty-ninth Day of August, 2023

Katherine Kelly Vidal
*Director of the United States Patent and Trademark Office*